(12) United States Patent
Lin et al.

(10) Patent No.: US 11,205,586 B2
(45) Date of Patent: Dec. 21, 2021

(54) INTEGRATED CIRCUITS WITH LINE BREAKS AND LINE BRIDGES WITHIN A SINGLE INTERCONNECT LEVEL

(71) Applicant: Intel Corporation, Santa Clara, CA (US)

(72) Inventors: Kevin Lin, Beaverton, OR (US); Christopher J. Jezewski, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/651,295

(22) PCT Filed: Dec. 27, 2017

(86) PCT No.: PCT/US2017/068561
§ 371 (c)(1),
(2) Date: Mar. 26, 2020

(87) PCT Pub. No.: WO2019/132889
PCT Pub. Date: Jul. 4, 2019

(65) Prior Publication Data
US 2020/0321246 A1   Oct. 8, 2020

(51) Int. Cl.
*H01L 21/768* (2006.01)
*H01L 21/311* (2006.01)
*H01L 23/528* (2006.01)

(52) U.S. Cl.
CPC .. *H01L 21/76816* (2013.01); *H01L 21/31144* (2013.01); *H01L 23/5283* (2013.01)

(58) Field of Classification Search
CPC ......... H01L 21/76816; H01L 21/31144; H01L 23/5283
See application file for complete search history.

(56) References Cited

U.S. PATENT DOCUMENTS

2004/0071991 A1   4/2004   Atakov et al.
2007/0216030 A1   9/2007   Schindler et al.
(Continued)

FOREIGN PATENT DOCUMENTS

WO   2017111924   6/2017
WO   2017204820   11/2017

OTHER PUBLICATIONS

International Preliminary Report on Patentability from PCT/US2017/068561 dated Jul. 9, 2020, 12 pgs.
(Continued)

*Primary Examiner* — Karen Kusumakar
(74) *Attorney, Agent, or Firm* — Green, Howard & Mughal LLP

(57) ABSTRACT

Integrated circuit (IC) interconnect lines having line breaks and line bridges within one interconnect level that are based on a single lithographic mask pattern. Multi-patterning may be employed to define a grating structure of a desired pitch in a first mask layer. Breaks and bridges between the grating structures may be derived from a second mask layer through a process-based selective occlusion of openings defined in the second mask layer that are below a threshold minimum lateral width. Portions of the grating structure underlying openings defined in the second mask layer that exceed the threshold minimum lateral width are removed. Trenches in an underlayer may then be etched based on a union of the remainder of the grating structure and the occluded openings in the second mask layer. The trenches may then be backfilled to form the interconnect lines.

20 Claims, 9 Drawing Sheets

(56) References Cited

U.S. PATENT DOCUMENTS

| | | |
|---|---|---|
| 2009/0053892 A1 | 2/2009 | Meyer et al. |
| 2010/0038782 A1 | 2/2010 | Yang et al. |
| 2010/0164116 A1 | 7/2010 | Li et al. |
| 2011/0006645 A1 | 1/2011 | Chen et al. |
| 2012/0058640 A1 | 3/2012 | Kim et al. |
| 2012/0156881 A1 | 6/2012 | Haffner |
| 2012/0225550 A1* | 9/2012 | Blatchford ............ H01L 23/528 |
| | | 438/637 |
| 2013/0105948 A1 | 5/2013 | Kewley |
| 2014/0054535 A1 | 2/2014 | Chen et al. |
| 2014/0248773 A1 | 9/2014 | Tsai |
| 2015/0064916 A1 | 3/2015 | Shieh et al. |
| 2016/0225666 A1 | 8/2016 | Bouche et al. |
| 2016/0372369 A1 | 12/2016 | Shaviv |
| 2017/0110402 A1 | 4/2017 | Smith et al. |
| 2017/0352585 A1 | 12/2017 | Burns et al. |

OTHER PUBLICATIONS

International Search Report and Written Opinion from PCT/US2017/068561 dated Sep. 27, 2018, 13 pgs.
Extended European Search Report from European Patent Application No. 17936184.5 dated Jun. 24, 2021, 11 pgs.

\* cited by examiner

INTEGRATED CIRCUITS WITH LINE BREAKS AND LINE BRIDGES WITHIN A SINGLE INTERCONNECT LEVEL

CLAIM OF PRIORITY

This Application is a National Stage Entry of, and claims priority to, PCT Application No. PCT/US2017/068561, filed on Dec. 27, 2017 and titled "INTEGRATED CIRCUITS WITH LINE BREAKS AND LINE BRIDGES WITHIN A SINGLE INTERCONNECT LEVEL", which is incorporated by reference in its entirety for all purposes.

BACKGROUND

Device density in integrated circuits (ICs) continues to increase. Integrated circuits (e.g., microprocessors, chipset components, graphics chips, memory chips, optical chips, etc.) commonly include electrically conductive traces, separate layers of which are coupled together by vias. To date, conductive traces are typically formed in trenches defined by a lithographic process in which a photoresist layer may be spin-coated over a dielectric layer. The photoresist layer may be exposed to radiation through a patterned mask, and the exposed photoresist developed in order to form an opening. Next, an opening for the trench may be etched in the dielectric layer by using the photoresist layer as an etch mask. This opening is referred to as a trench. Finally, the trench may be back filled with one or more metals or other conductive materials to form a conductive trace embedded within the dielectric layer.

One measure of the size of a trace is the critical dimension (CD). One measure of the spacing of a set of traces is their pitch. In the past, the sizes and the spacing of traces have progressively decreased. However, when patterning extremely small conductive line ends having extremely small pitches with lithographic processes, several challenges present themselves, particularly when the pitches are ~70 nanometers (nm), or less, and/or when the critical dimensions of the line ends are ~35 nm, or less. One challenge is that the critical dimensions of the line ends generally tend to scale faster than the resolution capabilities of the lithographic scanners. Extremely small spaces between line ends for example may be below the resolution capabilities of even extreme ultraviolet (EUV) lithographic scanners. As a result, it is common now for multiple lithographic masks to be used in a multiple patterning process to form a conductive interconnect trace. Such multiple patterning processes can increase IC interconnect costs dramatically, making it the integration of such processes very important to final IC chip cost.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1:
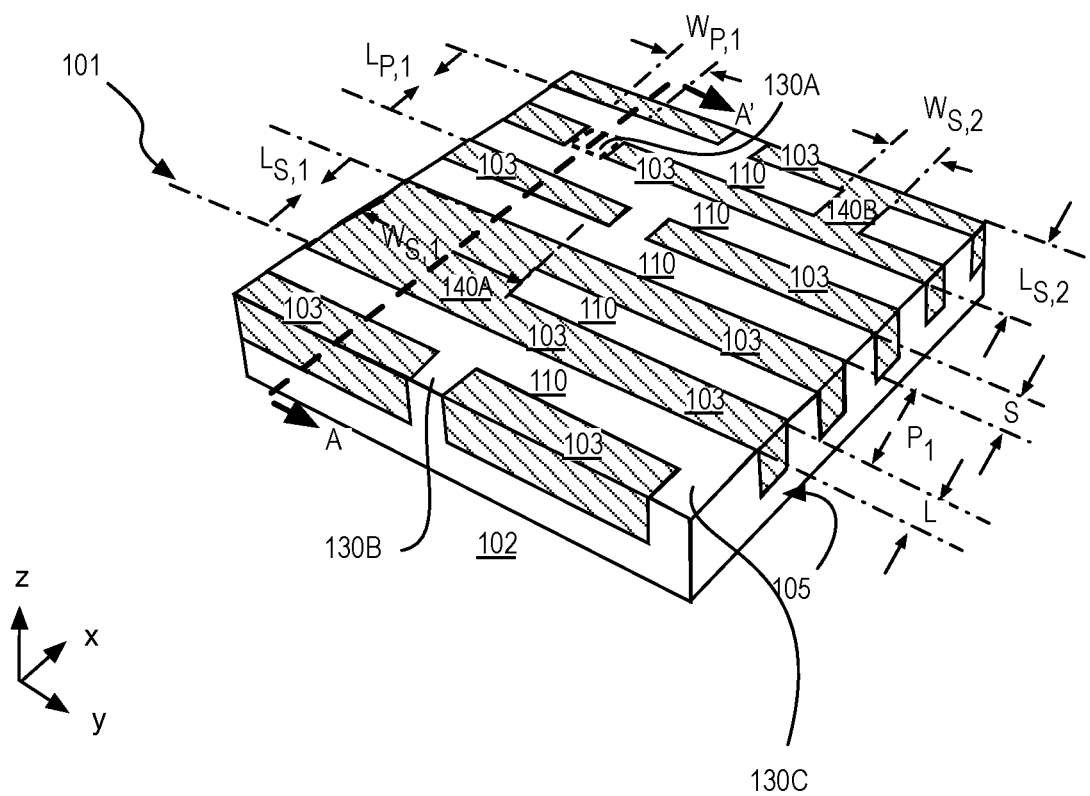
FIG. 1 is an isometric illustration of a portion of an IC structure including a single IC interconnect level having both line breaks and line bridges, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods and architectures associated with interconnect line "plugs" that define separations or breaks between two conductive line ends are described below. Methods and architectures associated with interconnect line "staples" that bridge two adjacent conductive lines are further described below. A plug is a non-conductive (e.g., dielectric) space or interruption between adjacent, collinear conductive lines of a given interconnect level, which may also be referred to as a "pillar," "post" or "cut" bifurcating conductive interconnect lines that would otherwise be electrically continuous. As such, plugs are present in-plane, or in the same level, with conductive lines of a given metal interconnect level. A "staple" is a conductive interconnect line segment that intersects two or more adjacent, non-collinear conductive lines of a given interconnect level, bridging the non-collinear lines that would otherwise not be electrically interconnected. A staple interrupts dielectric material that would otherwise electrically isolate two adjacent conductive lines. Staples may have lengths substantially orthogonal to the lengths of adjacent conductive lines that are bridged by the staples. In accordance with exemplary embodiments, the staples are also present in-plane, or in the same interconnect level, as the lines that are bridged by the staple. As described further below, both plugs and staples may be advantageously defined with a single mask level. Embodiments herein may therefore reduce mask count and/or increase interconnect density (e.g., by eliminating overlay tolerances associated with a separate plug and staple mask levels).

In accordance with some embodiments described further below, a lithographic plate or reticle that prints photoresist mask structures in a photoresist at a given pitch (P) may be employed, for example with a pitch-retaining patterning technique, or a pitch-splitting patterning technique, to define line (trench) widths and spaces between line lengths. Exemplary pitch-splitting techniques include pitch halving (P/2), or pitch quartering (P/4) hardmask patterning technique, either of which may be employed to pattern a first mask layer. Another masking operation then defines both plugs and staples, which either bridge adjacent first mask layer lines, or segment a given line, respectively. The resulting segmented and joined lines may then be translated into a trench pattern in an underlying material layer (e.g., any suitable dielectric), which may then be backfilled with conductive material to form traces having any complex damascene-type interconnect structure. Because of the fabrication technique, the interconnect structure can be fabricated at the scaled-down geometries achievable with pitch-splitting multiple patterning techniques. Some exemplary embodiments described below illustrate the use of one-dimensional (1D) grating mask structures. A grating mask is advantageously amenable to both direct patterning and pitch-splitting techniques (e.g., P/2 and P/4 patterning techniques). The exemplary embodiments described below illustrate the fabrication of 2D conductive traces from two masking layers where one of the masking layers is a 1D grating and the other is a 2D mask that defines polygons of arbitrary shape and lateral dimensions. One or more of the features described below may be practiced in accordance with embodiments further described herein to arrive at interconnect structures having one or more of the structural features described herein.

Some exemplary embodiments described below illustrate structural features indicative of fabrication processes that apply the principles taught herein. Hence, while various mask structures described below may be ephemeral, final structures in the IC that serve as a lasting fingerprint of the fabrication process are highlighted. For example, dielectric plugs fabricated as described below may have first lateral widths or lengths in a first dimension that are discrete, integer functions of the pitch of the interconnect lines terminated by the plugs. The dielectric plugs may further have second lateral widths or lengths in a second dimension, orthogonal to the first dimension, that are non-discrete. Likewise, conductive staples fabricated as described below may have first lateral widths or lengths in the first dimension that are also discrete, integer functions of the pitch of the interconnect lines intersected by the staples. The conductive staples may further have second lateral widths or lengths in the second dimension that are unequal to the second lateral widths or lengths of the plugs. The staples may have second lateral widths or lengths that are larger than the second lateral widths or lengths of the plugs by an arbitrary, non-discrete, amount. The differences in the lateral dimensions between plugs and staples are further indicative of the single-mask level technique described herein. As described further below, plugs may be fabricated from a polygon smaller than a threshold lateral length and/or width, while staples may be fabricated from a polygon that is larger than the threshold lateral dimension.

FIG. 1 is a perspective view of a portion of an IC that has an IC interconnect structure 101 including line segments 103 over a dielectric material 105 within a plane (e.g. x-y dimension) of a single interconnect level. IC interconnect structure 101 may be a portion of any IC interconnect level over any substrate 102. For example IC interconnect structure 101 may be a first interconnect level (e.g., metal 0), or a higher interconnect level (e.g., metal 1-7). Substrate 102 may, for example, further includes active devices, such as, but not limited to transistors (e.g., CMOS field effect transistors) that have terminals coupled to various ones of the conductive line segments 103. Within IC structure 101, line segments 103 extend lengthwise in a first dimension (e.g., in y-dimension). In exemplary embodiments, line segments 103 are parallel and may be considered a grating modified with line segment deletions and line segment bridges. Line segments 103 may be of any conductive material, as embodiments herein are not limited in this context. For example, line segments 103 may be of one or more metal (e.g., Ti, W, Cu, Al, Ru, etc.), doped semiconductor (e.g., polysilicon, etc.), or the like (e.g., nitrides of these metals). Line segments 103 may form an array of any number of adjacent, non-collinear electrical traces. A dielectric material 110 separates sidewalls of adjacent line segments 103. Dielectric material 110 may have the same composition as dielectric material 105 that is below line segments 103. Dielectric material 110 and/or dielectric material 105 may both be interlayer dielectric (ILD) materials, as one example. Alternatively, dielectric material 105 may be a shallow trench isolation (STI) material, in another example. Dielectric material 110 and/or dielectric material 105 may each be any material known to provide sufficient electrical isolation between line segments 103, such as, but not limited to SiC, SiN, SiCN, SiO, SiON, SiOC, HSQ, MSQ, or the like. For these compounds, the group IV constituent might also be replaced, (e.g., germanium nitrides, metal germanides, etc.). Various light and transition metal oxides (e.g., AlOx, HfOx, ZrOx, TiOx) and their silicates are also possible.

The transverse width (e.g., x-axis) of line segments 103 may vary with technology node. In some embodiments line segments 103 have a pitch $P_1$ of 80 nanometer (nm), or less. Pitch $P_1$ may be substantially constant over a portion of, or an entirety of, an IC area. Pitch $P_1$ is equal to line width L summed with space width S. Line width L may be substantially constant over a portion of, or an entirety of, an IC area. In some embodiments where pitch $P_1$ is 80 nm, or less, line width L is 40 nm, or less. For example, line width L may be 5-40 nm. Dielectric material 110 extends lengthwise in the first direction (e.g., in y-dimension) with the transverse width of dielectric material 110 being equal to space width S. Space width S may be substantially constant over a portion of, or an entirety of, an IC area. In exemplary embodiments where pitch P1 is 80 nm, or less, space width S is 40 nm, or less. In some embodiments, space width S is unequal to line width L. For example, space width S may be larger (e.g., at least 5 nm) than line width L (e.g., no more than 8 nm). Alternatively, space width S may be smaller (e.g., no more than 8 nm) than line width L (e.g., at least 5 nm). In other embodiments, space width S is substantially equal to line width L.

Top and sectional views of dielectric plugs 130A, 130B and 130C are further illustrated in FIG. 1. Plug 130A is denoted in dashed line as spanning the width between adjacent lines or stripes of dielectric material 110 in the second dimension of the interconnect plane (e.g., x-dimension). Because plugs 130 may have the same composition as dielectric material 110 (e.g., including oxygen and silicon), there may be no material or microstructural interface (i.e., a homogenous material) proximal to the dashed line denoted in FIG. 1. Hence, the geometry, and/or lateral dimensions, and/or locations of plugs 130 relative to other structures may be the primary indicator(s) of the fabrication process.

In the first dimension of the interconnect plane, plug 130A has a width at least equal to the conductive line width L. In this dimension, plug 130A bridges two adjacent lines of dielectric material 110 such that adjacent non-collinear conductive line segments 103 are spaced apart by a plug length $L_{P,1}$ that is an integer multiple (e.g., N) of the space width S summed with a smaller integer multiple (e.g., N−1) of the line width L. More specifically, plug length $L_{P,1}$=2S+L. All of plugs 130 (e.g., 130A, 130B, 130C) within a partial area, or over an entire area, of an IC may have a plug length $L_P$ that satisfies the function (N)S+(N−1)L. In the other dimension (e.g., y-dimension), plug 130A separates ends of collinear line segments 103 by a plug width $W_{P,1}$. Unlike $L_{P,1}$ that is discretized by the fixed line and space width of line segments 103, plug width $W_{P,1}$ is at least equal to the space width S, but may otherwise vary without constraint.

A top view of conductive line segments or "staples" 140A and 140B is further illustrated in FIG. 1. Line segment 140A spans the staple end-to-end length $L_{S,1}$ in the first dimension of the interconnect plane (e.g., x-dimension). Staple length $L_{S,1}$ is an integer multiple (e.g., N) of line width L summed with a smaller integer multiple (e.g., N−1) of the space width S. More specifically, staple length $L_{S,1}$=2L+S. Hence, since N is equal one for $L_{S,1}$ and $L_{P,1}$, the difference between $L_{S,1}$ and $L_{P,1}$ is only a function of the difference between space width S and line width L. Line segment 140A intersects and bridges the space S between one pair of adjacent non-collinear line segments 103 over the staple width $W_{S,1}$ in the second dimension of the interconnect plane (e.g., y-dimension). Unlike $L_{S,1}$ that is discretized by the fixed line and space width of conductive line segments 103, staple width $W_{S,1}$ may have any arbitrary size. In some embodiments staple width $W_{S,1}$ is further independent of plug width $W_{P,1}$. For example, staple width $W_{S,1}$ is not a discrete integer multiple of plug width $W_{P,1}$. In the embodiments illustrated, at least one of staple length $L_S$ and staple width $W_S$ is larger than a respective one of plug length $L_P$ or plug width $W_P$. For embodiments where staple length $L_S$ is equal to plug length $L_P$ (e.g., because space width S and line width L are equal), staple width $W_S$ is necessarily larger than plug width $W_P$.

Line segment or "staple" 140B spans the staple length $L_{S,1}$ in the first dimension of the interconnect plane (e.g., x-dimension). Staple end-to-end length $L_{S,2}$ is again equal to 2S+L, however line segment 140B intersects and bridges a space S between one pair of adjacent non-collinear line segments 103 over the staple width $W_{S,2}$ which is smaller than $W_{S,1}$, for example. Notably, all line segments in the IC structure shown in IC structure 101 are either line segments 103 or line segments 140. No other type of line segment is present, and all routing of interconnects within IC structure 101 is constrained to being implemented through combinations of line segments 103 and line segments 140 in combination with plugs 130. Also of note, all line segments 103 are planar with line segments 140 with routing of interconnects within IC structure 101 implemented in only one interconnect level.

A number of methods may be employed to fabricate the structures described in the context of IC structure 101. FIG.

2 is a flow diagram illustrating exemplary methods 200 for fabricating interconnect structures. In some embodiments, the structures illustrated in IC structure 101 are fabricated according to methods 200. In methods 200, any mask structures having at least the threshold minimum lateral dimensions are ultimately translated into line segments (staples) that can merge multiple line segments, while any mask structures that do not have at least the threshold minimum lateral dimensions are ultimately not translated into line segments and instead generate a plug disrupting one or more line segment. FIG. 3-11 illustrate views of an IC structure with an interconnect level evolving as operations in the methods 200 are practiced, in accordance with some exemplary embodiments.

Figure 2:
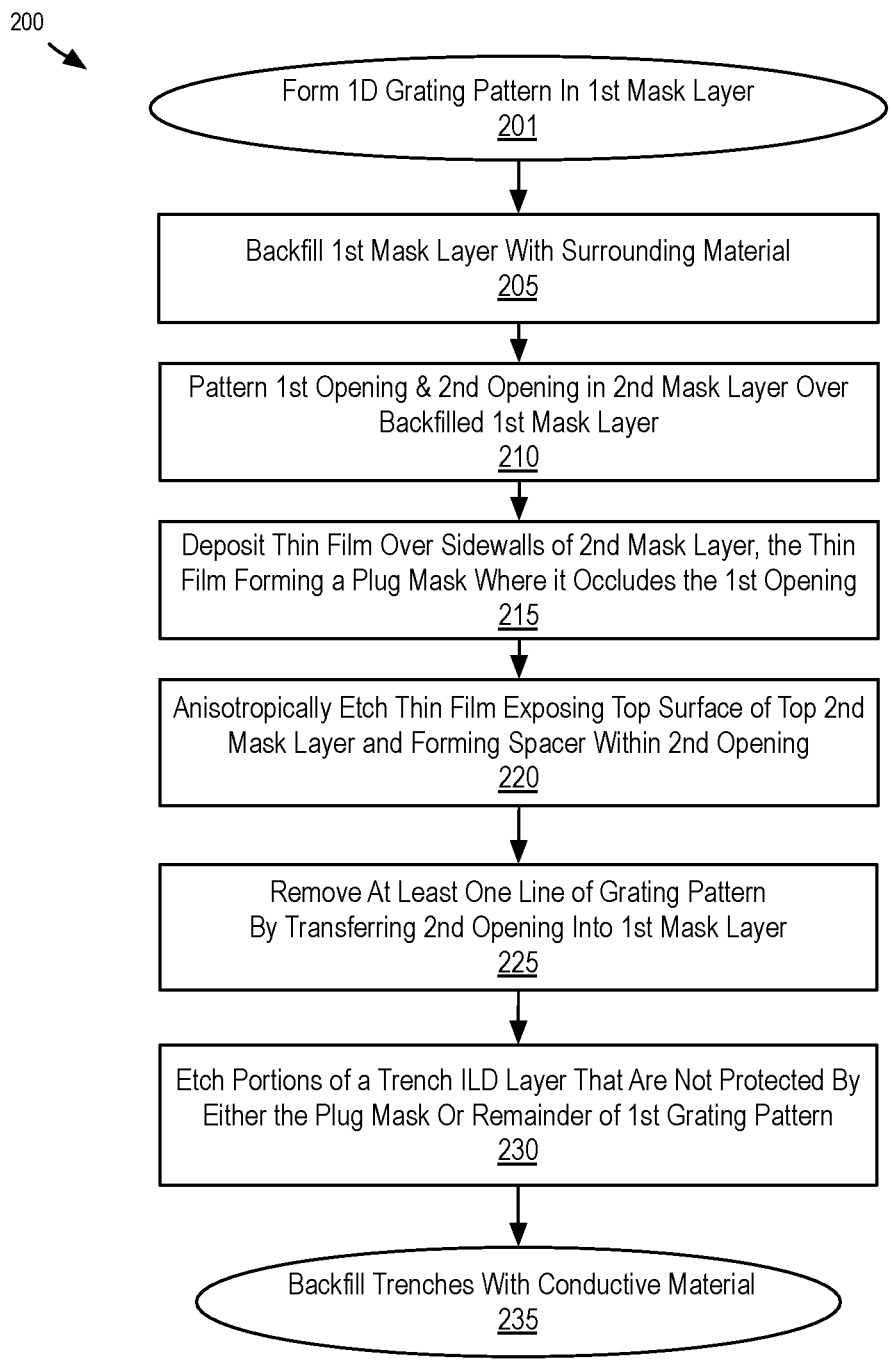
FIG. 2 is a flow diagram illustrating methods of fabricating an IC interconnect level including both line breaks and line bridges, in accordance with some embodiments.

Referring first to FIG. 2, methods 200 begin at operation 201 where a workpiece is received. The workpiece may be any known to be suitable for subsequent processing. In some exemplary embodiments, the workpiece is any known to be suitable for IC manufacture. In some such embodiments, the workpiece received at operation 201 includes a crystalline semiconductor substrate, such as but not limited to, a crystalline silicon wafer. The workpiece received at operation 201 includes a first mask layer having first mask structures, and one or more underlayers that are to be subsequently patterned based, at least in part, on the first mask structures. The first mask structures may be of any material suitable as a mask for a subsequent patterning process. The underlayers may be part of a handling substrate (e.g., crystalline semiconductor), and/or may include any suitable thin film(s) such as, but not limited to, one or more interlayer dielectric materials, metals, or semiconductor layers.

Figure 3:
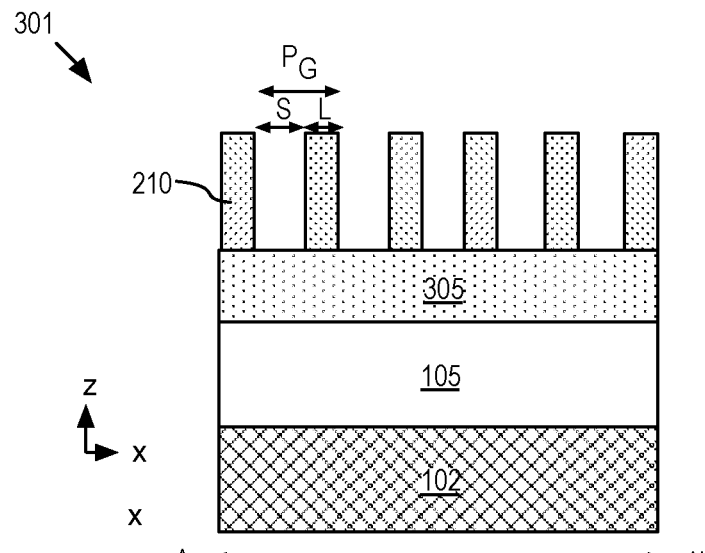
FIG. 3, 4, 5A are cross-sectional views of an IC interconnect level evolving as operations in the methods illustrated in FIG. 2 are practiced, in accordance with some embodiments.
Figure 4:
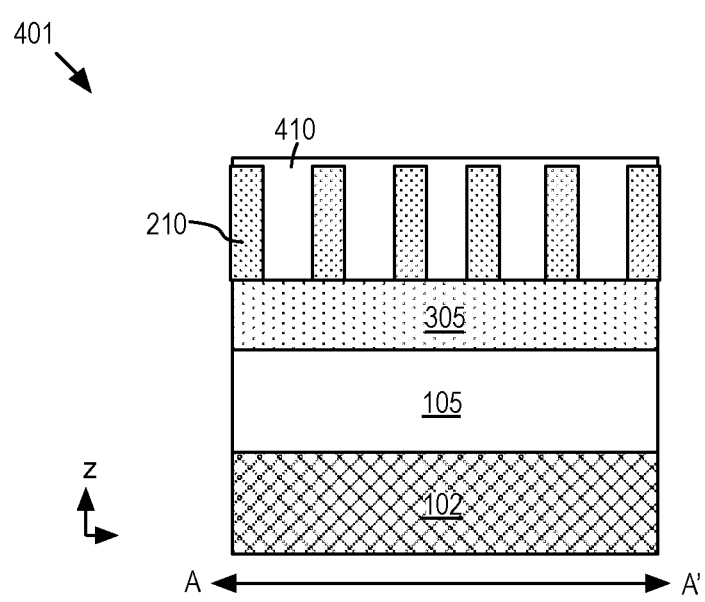

In the example shown in FIG. 3, IC structure 301 includes first mask structures 210 over an unpatterned mask layer 305. Mask layer 305 is over dielectric material 105, and dielectric material 105 is over substrate 102. Mask materials suitable for mask structures 210 and mask layer 305 include carbon-based hardmask materials (CHM), silicon oxides (e.g., include silicon and oxygen), silicon nitrides (include silicon and nitrogen), silicon carbides (include silicon and carbon), carbon-doped oxides (include silicon, oxygen, carbon, and hydrogen). Other materials, including metals, such as, but not limited to, TiN (includes titanium and nitrogen), may also be employed. As described above dielectric material 105 may be any dielectric material known to be suitable as an IC ILD (e.g., silicon oxides, carbon-doped oxides, other low-k materials, etc.).

The first mask structures received at operation 201 (FIG. 2) include structures of a first lateral width (i.e., in the plane of the workpiece). In some embodiments, the first mask structures have a "minimum lateral width" that is in name only (i.e. nominal), as individual mask structures with this minimum lateral width will not necessarily have exactly the same actual lateral widths. The first mask structures having the nominal minimum lateral width are of the same class of structures targeting some same minimum lateral width. In some embodiments, a vast majority, if not all, of the first mask structures have substantially the same actual minimum lateral width with some distribution about the target minimum lateral width as a result of process tolerances. As used herein, the qualifier "substantially" is employed in the recognition that manufacturing processes output a population characterized by some distribution statistics. In this context, a vast majority, if not all, of the first mask structures received at operation 201 have a target minimum lateral width +/−10% of that target minimum lateral width. These first mask structures may further have any lateral length to occupy any footprint over the workpiece, as embodiments herein are not limited in this context.

In the example shown in FIG. 3, mask structures 210 have a nominal lateral line width L and are spaced apart by a nominal space width S such that mask structures 210 are characterized by a nominal grating pitch $P_G$. Mask structures 210 may have been defined using any suitable techniques. For example, one or more lithographic processes (e.g., extreme UV) and/or subtractive processes (e.g., hardmask etching) and/or additive processes (e.g., thin film deposition) may have been practiced upstream to generate mask structures 210. In some embodiments, mask structures 210 are generated by a multi-patterning process, such as, but not limited to, pitch-quartering. Such techniques may achieve a target minimum lateral width of 5-40 nm, for example. Lateral spacing width S may be equal to, more than, or less than, the target lateral width of the structures. In some exemplary embodiments lateral space width S is 5-40 nm.

Returning to FIG. 2, methods 200 continue at operation 205 where a mask cap material is deposited over the first mask layer structures. The mask cap material may be any material known to be suitable as a mask material compatible with subsequent processing. The mask cap material may advantageously be of a composition that can be removed selectively (i.e., at a higher rate) relative to the first mask structures, and relative to the underlayer(s). The mask cap material may be deposited with any technique known to be suitable for the material. In some advantageous embodiments, the mask cap material is deposited with a super conformal process to completely backfill spaces between the first mask structures. Flowable depositions and spin-on techniques may be employed, for example. Optionally, the mask cap material may be subjected to further planarization processes (e.g., chemical-mechanical polish). In the example further illustrated in FIG. 4, structure 401 includes structure 301 and mask cap material 410, which backfills mask features 210. In exemplary embodiments, mask cap material 410 is of a different composition than mask structures 210, with this difference providing a basis of etch selectivity between the two.

Returning to FIG. 2, methods 200 continue at operation 210 where first and second openings are patterned in a second mask layer over the first mask layer. All first openings have lateral dimensions smaller than a threshold. All second openings are larger than the first openings, having lateral dimensions that are at least larger than the threshold. The second mask layer may be any suitable photosensitive or hard mask material. If the second mask layer material is a hard mask, such as SiO, SiN, SiON, etc., it may be patterned according to any suitable technique. For example, openings may be etched into the second mask layer based on an overlying photosensitive material layer that has been lithographically patterned. In the example shown in FIG. 5A, IC structure 501 includes structure 401 and a mask material 505. An opening 510A and another opening 512A have been patterned into a mask material 505. Mask material 505 may have any composition, but in some advantageous embodiments, mask material 505 has a composition different than both mask structures 210 and mask cap material 410 to ensure some level of etch selectivity (e.g., mask material 505 can be etched selectively) relative to mask structures 210 and mask cap material 410.

Figure 5A:
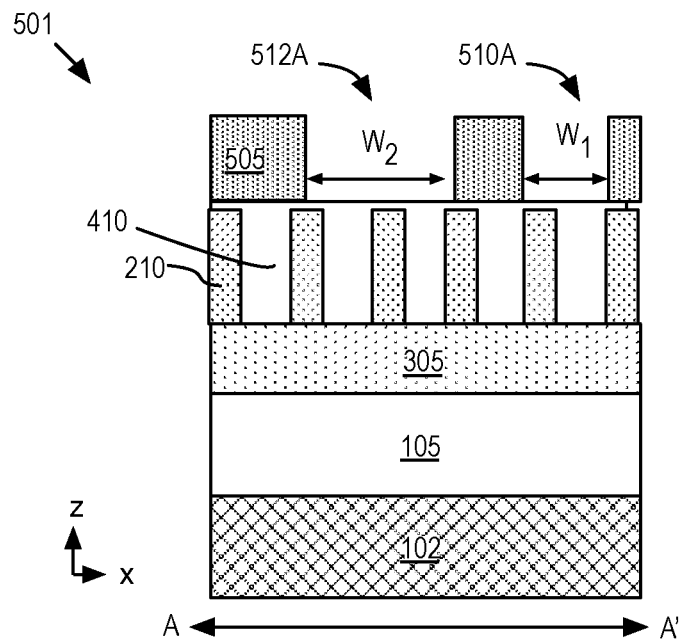
FIG. 5B is a plan view of the IC interconnect level illustrated in FIG. 5A, in accordance with some embodiments.
Figure 5B:
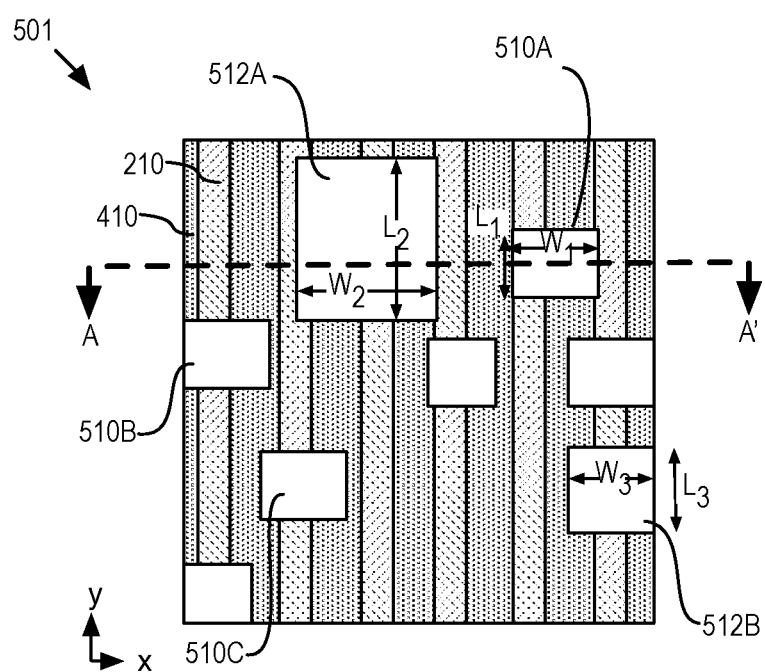

Opening 510A has a lateral width $W_1$, while opening 512A has a lateral width $W_2$ that is larger than width $W_1$. FIG. 5B, is a plan view that indicates where the cross-sectional plane A-A' of FIG. 5A passes. As further shown in FIG. 5B, opening 510A has a lateral length $L_1$, while opening 512A has a lateral length $L_2$, that is larger than length $L_1$. In exemplary embodiments, at least one of $L_1$ and $W_1$ is smaller than a threshold lateral dimension, while both of $L_2$ and $W_2$ are larger than the threshold lateral dimension. As further shown in FIG. 5B, opening 510A is one of a plurality of openings 510. At least one of the length or width of all openings 510 (e.g., openings 510B, 510B and 510C) is smaller than the threshold lateral dimension. Opening 512A is likewise one of a plurality of openings 512. Both the length and width of all openings 512 (e.g., openings 512A, 512B) are larger than the threshold lateral dimension. Hence, opening 512B has a length $L_3$ that is also greater than the threshold lateral dimension. Opening 512B has a width $W_3$ that is greater than the threshold lateral dimension. Notably, openings 510 and 512 are 2D polygons (i.e., not 1D grating patterns), which may be sized independently from each other to have arbitrary lengths L and arbitrary widths W.

Methods 200 (FIG. 2) continue at operation 215 where a thin film is deposited over sidewalls of the openings that were patterned into the second mask layer. The thin film is advantageously deposited with a conformal deposition process such that the film thickness on sidewalls of the openings is well-controlled, and may be approximately (e.g., +/−10%) equal to a target thickness deposited over top surfaces of the second mask layer. The thin film is deposited to a thickness sufficient to fully occlude, or backfill, openings in the second mask layer dimensioned below the threshold dimension, but insufficient to fully occlude openings in the second mask layer dimensioned above the threshold dimension. The thin film deposition process at operation 215 may therefore be targeted to deposit a film having a thickness that is approximately half of the threshold dimension, or with some margin greater than half of the threshold dimension. For example, where the threshold opening dimension is 8 nm, a 4-5 nm thin film may be deposited at operation 215. The thin film deposited at operation 215 may be any material known to be suitable for such an application. For example, any dielectric material (e.g., metal oxide, CHM material, SiO, SiN, SiON, etc.), semiconductor material (e.g., Ge, SiGe, etc.), or metal (e.g., W) that can be conformally deposited (e.g., by chemical vapor deposition or atomic layer deposition) may be deposited at operation 215. In some advantageous embodiments, the thin film deposited at operation 215 has composition different than that of mask material 505.

Figure 6:
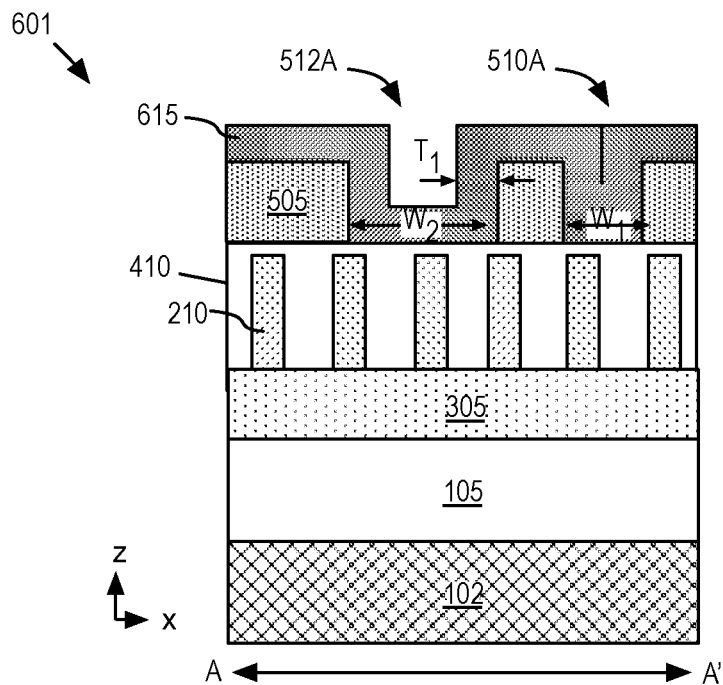
FIG. 6, 7, 8, 9, 10, 11 are cross-sectional views of an IC interconnect level evolving as operations in the methods illustrated in FIG. 2 are practiced in accordance with some embodiments.
Figure 7:
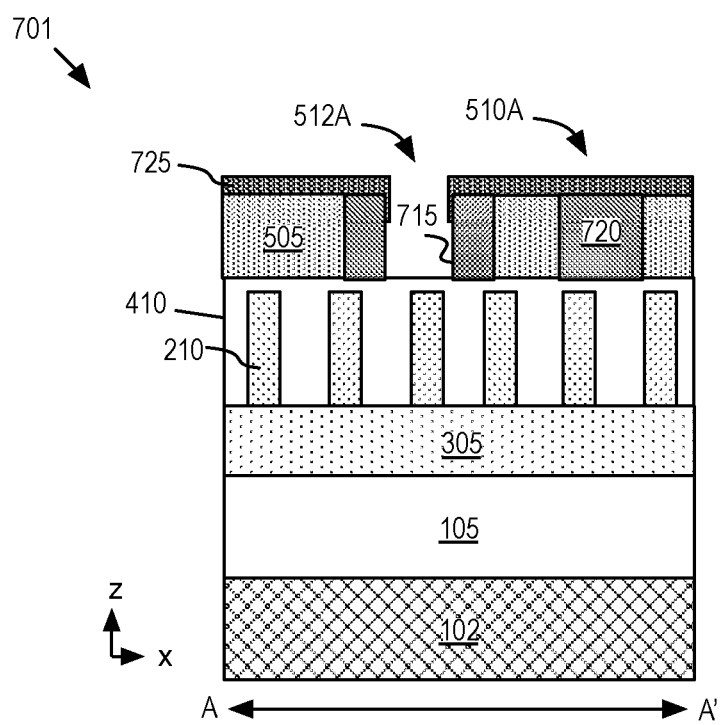
Figure 8:
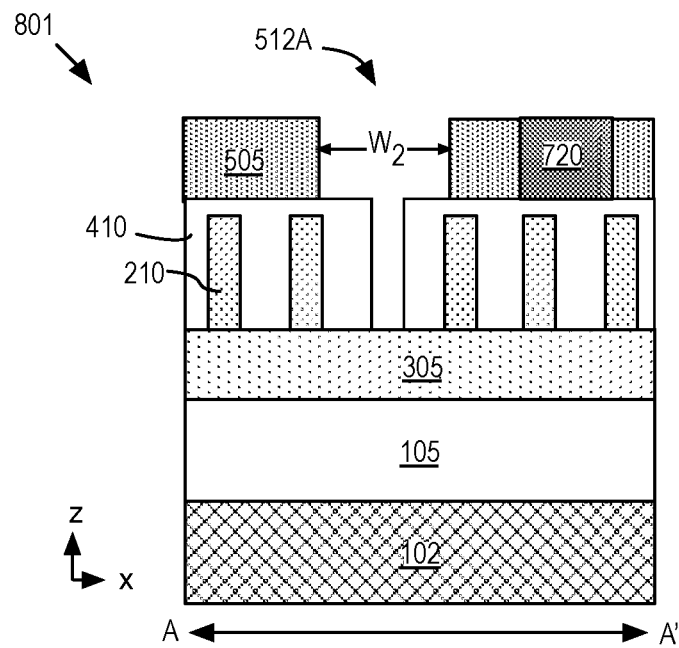

In the example further shown in FIG. 6, IC structure 601 includes structure 501, which is covered with a thin film material 615. Thin film material 615 has a sidewall thickness $T_1$, which is sufficient to fully occlude opening 510A, but merely reduces the lateral dimensions of opening 512A to a recess having a lateral dimension of approximately $W_2-2T_1$. Although not illustrated, thin film material 615 similarly reduces the lateral dimensions of openings 510A and 512A in the orthogonal dimension (e.g., y-dimension) such that if either lateral dimension is below the threshold, the opening will be fully occluded. Hence, although opening 510A has a width $W_1$ that is below the threshold for the sake of illustrating occlusion by thin film material 615, if the second dimension of opening 510A (e.g., $L_1$ in FIG. 5B) is below the threshold, opening 510A will be occluded even when width $W_1$ is any size. Opening 512A has a width $W_2$ that is above the threshold, illustrating how thin film material 615 covers, but fails to completely fill-in, opening 512A. The second dimension of opening 512A (e.g., $L_2$ in FIG. 5B) is also above the threshold.

Returning to FIG. 2, methods 200 continue at operation 220 where the thin film deposited at operation 220 is etched to expose a top surface of the second mask layer as well as a bottom of the openings formed in the second mask layer. This etch may be anisotropic, in which case a residual spacer may be left along the sidewalls of the openings. Lateral dimensions of the residual spacer are dependent on the sidewall thickness of the thin film and the etch bias of the spacer-etchback process and may be tuned to achieve any suitable lateral spacer width desired. Any anisotropic etch process (e.g., dry plasma etch or develop, etc.) may be practiced as embodiments are not limited in this context. In the example further illustrated in FIG. 7, IC structure 701 includes structure 501 with the addition of sidewall spacers 715. As further illustrated, where thin film material 615 fully occluded opening 510A, the spacer etchback process leaves a plug mask 720 that still fully occludes opening 510A. The larger lateral dimensions of opening 512A however have allowed the spacer etchback to re-expose a top surface of mask structures 210 and mask cap material 410. A lateral dimension (e.g., diameter) of opening 512A is however reduced by approximately twice the lateral width of spacer 715, which is, for example, some function of $T_1$.

Optionally, to recover the lateral width of opening 512A (e.g., $W_2$ in FIG. 6) additional processing may be performed to remove any residual spacer. For example, another thin film mask may be anisotropically deposited to cover top surfaces of the second mask material 505 and top surfaces of remaining thin film material 615 (and top surfaces of spacer 715) with a cap material 725. Cap material 725 may, for example, be deposited with a physical vapor deposition (PVD) or other deposition process with similar anisotropy such that little, if any, cap material 725 is deposited on sidewalls of spacer 715 (e.g., as a result of solid angle shadowing, etc.). Cap material 725 may have any composition (e.g., dielectric, semiconductor, metal) as embodiments are not limited in this respect beyond noting that it may be advantageous for the composition of cap material 725 to be different from that of spacer 715 so that portions spacer 715 left uncovered by cap material 725 may be selectively removed (e.g., etched isotropically). Following spacer removal, cap material 725 may then be deliberately stripped (e.g., with a selective etch), or simply allowed to erode during subsequent processing.

Alternatively, an isotropic etch process may be employed at operation 220. In such embodiments, thin film material 615 may be removed with an isotropic etch that targets the nominal thickness of the thin film (with suitable over etch) to expose surfaces that are covered with only the nominal cap layer thickness. During operation 220, cap layer material within the sub-threshold openings 510A is not completely removed because of the greater effective thickness of thin film mask material 615 within such openings. For super-threshold openings, sidewalls of the second mask pattern that are spaced apart by more than the threshold distance will be exposed. Hence, the original lateral width of the mask openings is recovered for all those mask openings larger than the threshold lateral dimension. Regardless of the etchback technique employed at operation 220, the single patterning process employed to form openings of different dimensions in the second mask layer is leveraged to form both openings that expose the underlying mask layer and plug masks. Alignment between these plug masks and openings are therefore all perfectly (self)aligned to one another.

Returning to FIG. 2, methods 200 continue at operation 225 where at least some of the underlying mask structures are removed by translating the openings in the second mask layer into the first mask layer. In the exemplary embodiments where the underlying mask structures comprise grating lines, at least one of the lines in the first mask layer that is located below the opening in the second mask layer is removed during operation 225, for example with a suitable selective and/or anisotropic etch. In the example further illustrated in FIG. 8, IC structure 801 includes IC structure 501 and plug mask 720. As shown, spacer 715 and cap material 725 has been removed such that opening 512A has regained the lateral width $W_2$. One mask structure 210 that was exposed within opening 512A has been etched away, down to hardmask material 205. A union of the opening 512A and mask structure 210 has thus been patterned into the first mask layer.

Figure 9:
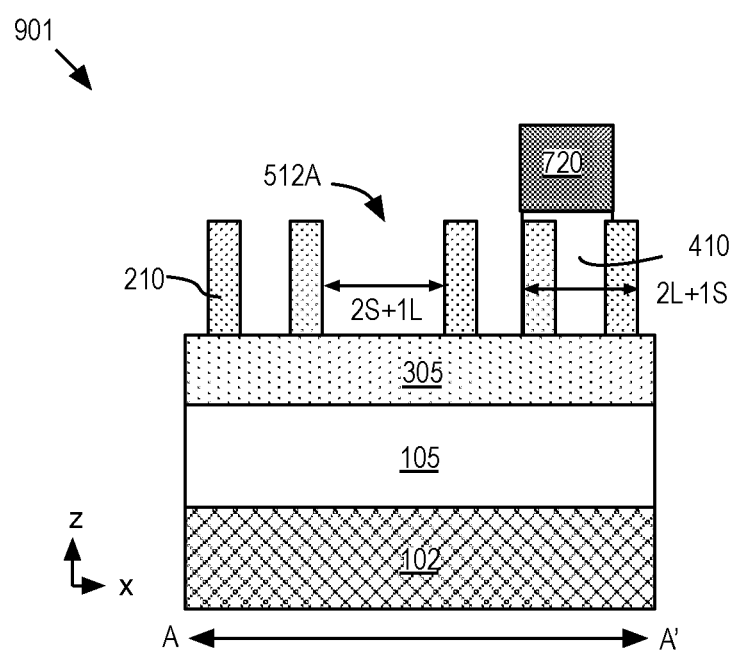
Figure 10:
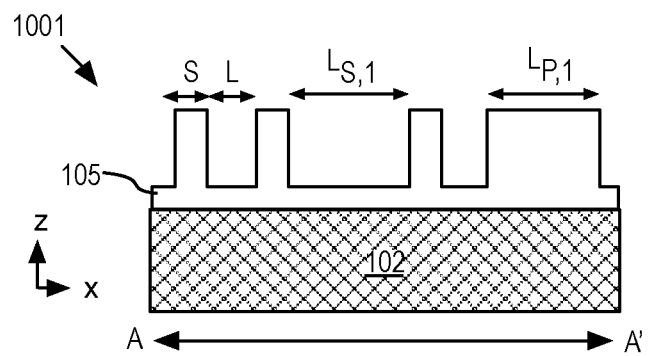

As further illustrated in FIG. 9, mask material 505 and mask cap material 410 not protected by plug mask 720 may be removed. In advantageous embodiments, mask material 505 and unprotected mask cap material 410 is removed with an etch that is selective to all remaining mask structures 210. As shown in FIG. 9, IC structure 901 includes IC structure 801, less mask material 505 and mask cap material 410, which may, for example, have be removed with an etch process that removes mask material 505 and mask cap material 410 at a rate significantly higher than any erosion of plug mask 720 and mask structures 210. Following this mask strip, the underlayer (e.g., mask layer 305) is masked by a remainder of mask structures 210 summed with plug mask 720. As long as plug mask 720 has sufficient lateral dimensions to overlap adjacent mask structures 210, the union of plug mask 720 with mask structures 210 has discrete lateral dimensions that are integer multiples of the line width L and space width S associated with the first mask level. Specifically, in FIG. 9, a union of plug mask 720 and two adjacent mask structures 210 have a lateral dimension equal to 2L+S. Similarly, since mask opening 512A had lateral dimensions which exposed an integer number (e.g., one) of mask structures 210, the spacing of adjacent mask structures 210 is increased from S (e.g., to 2S+L) within a footprint of mask opening 512A.

Returning to FIG. 2, methods 200 continue at operation 230 where the underlayer(s) are patterned based on a union or summation of the remaining first mask structures and residual mask cap material that was protected by the plug mask. Operation 230 may entail any etch process(es) that is(are) known to be suitable for removing unmasked portions of the underlayer(s). In some embodiments, an anisotropic trench etch having suitable selectively for the underlayer(s) relative to both the first mask structures and the cap layer residue may be employed at operation 230 to remove portions of the underlayer(s) not masked by either the first mask structures or the mask cap material residue. The resulting structures fabricated in the underlayer(s) can include both discretely-sized blocks and discretely-sized line segments of a ILD trench pattern that may be the basis for a single 2D interconnect routing level.

Methods 200 complete at operation 235 where the structures generated at operation 230 are further processed according to any techniques known to be suitable for filling the pattern formed in the underlayer at operation 230. For example, the ILD trench pattern formed at operation 230 may be backfilled with one or more conductive materials (e.g., Ta-based liner and Cu-based fill metal) at operation 235 to form a single level of interconnect using any suitable technique (e.g., damascene or dual damascene). In the example shown in FIG. 10, IC structure 1001 includes the IC structure 901 less mask structures 210 and mask layer 305. As shown, a summation or union of the plug mask and mask structures has been translated into dielectric material 105, for example with an anisotropic etch that has suitable selective for dielectric material 105 relative to the various mask materials. As illustrated, portions of dielectric material 105 are now spaced apart by line width L, or a staple length (e.g., $L_{S,1}$). The portions of dielectric material 105 either have a space width S, or a plug length (e.g., $L_{P,1}$). As further shown in FIG. 11, IC structure 101 is fabricated through deposition of any suitable conductive material, and any suitable planarization process, as embodiments are not limited in this context. IC structure 101 has any, or all, of the features described above in the context of FIG. 1. Backfill of the conductive material forms line segments 103, which may be bridged by line segment 140A, while plug 130A provides breaks in these conductive features. As shown, all of these features are included within a single interconnect layer or level.

Figure 11:
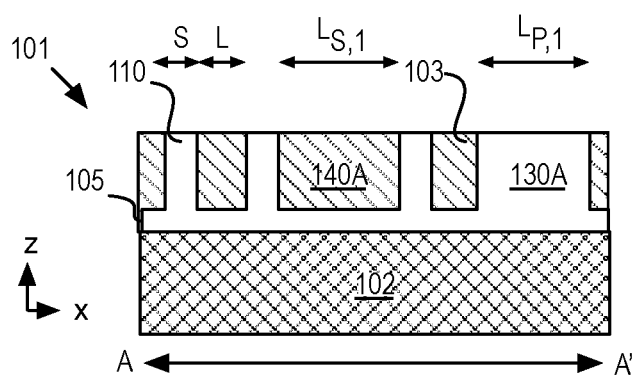

Although not illustrated in FIG. 11, substrate 102 may also include additional (e.g., lower) metallization interconnect layers for integrated circuits or electronic devices. Substrate 102 may also include electronic devices, such as transistors, memories, capacitors, resistors, optoelectronic devices, switches, or any other active or passive electronic devices.

Although methods 200 are described above in the specific context of interconnect structures for the sake of clearly conveying various aspects of the methods and highlighting structures indicative of practicing the methods, methods 200 may also be readily applied toward the fabrication of other IC structures. For example, methods 200 may be applicable to fabricating transistor terminals (e.g., gate electrodes), fabricating semiconductor fin structures, or other topographic features of an IC. It is understood that the skilled artisan should be able to apply methods 200 to any of these applications based on the interconnect embodiments described above.

Figure 12:
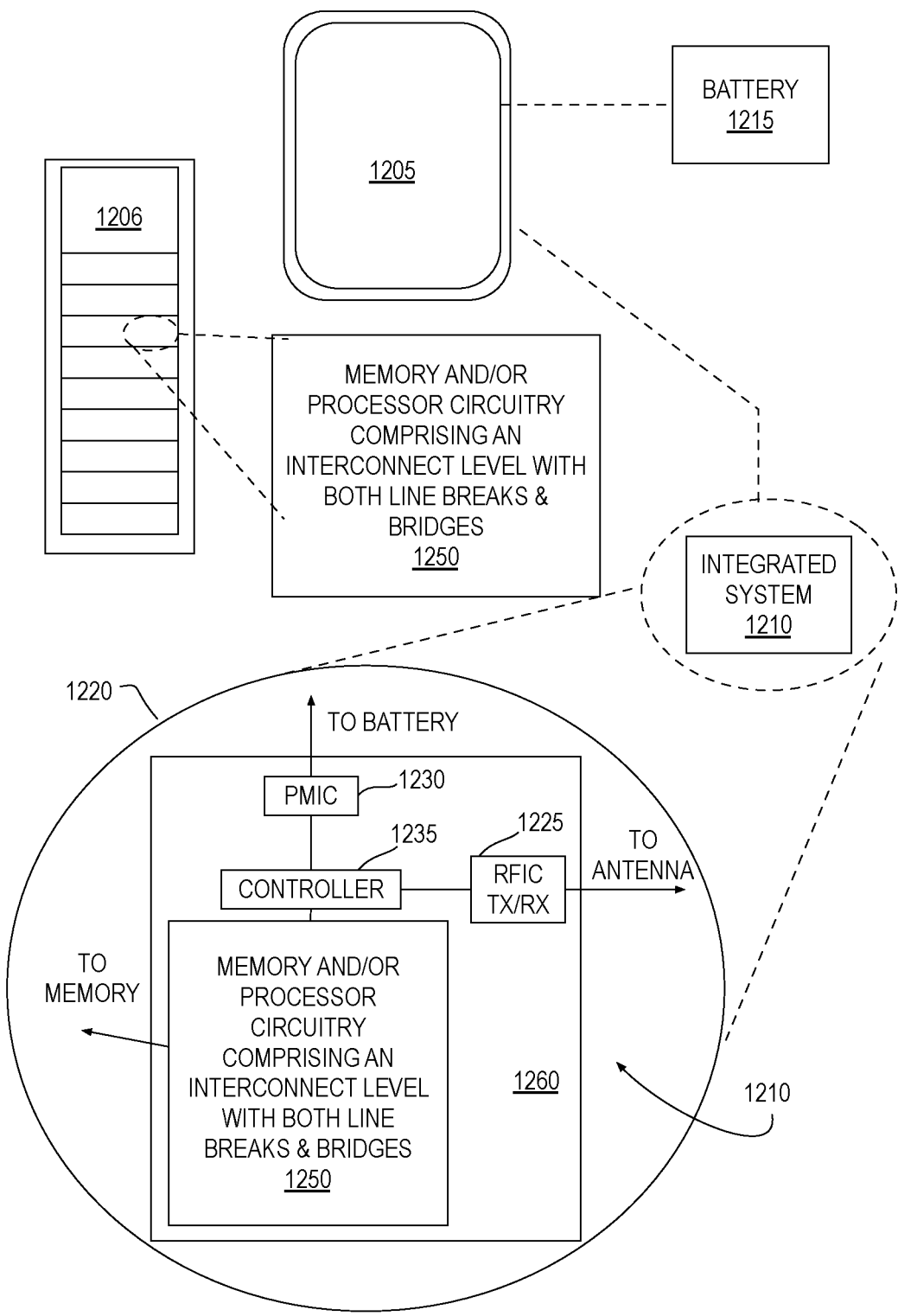
FIG. 12 illustrates a mobile computing platform and a data server machine employing an IC including interconnect levels having both line breaks and line bridges, in accordance with some embodiments.

FIG. 12 illustrates a mobile computing platform and a data server machine employing an IC including dimensionally scaled dual-damascene interconnect structures, for example including line breaks and line bridges in accordance with embodiments described herein. The server machine 1206 may be any commercial server, for example including any number of high-performance computing platforms disposed within a rack and networked together for electronic data processing, which in the exemplary embodiment includes a packaged monolithic SoC 1250. The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215.

Either disposed within the integrated system 1210 illustrated in the expanded view 1220, or as a stand-alone packaged chip within the server machine 1206, monolithic SoC 1250 includes a memory circuitry block (e.g., RAM), a processor circuitry block (e.g., a microprocessor, a multi-core microprocessor, graphics processor, or the like), either or both of which include dimensionally scaled dual-damascene interconnect structures (e.g., for example including line breaks and line bridges) in accordance with embodiments described herein. The monolithic SoC 1250 may be further coupled to a board, a substrate, or an interposer 1260 along with, one or more of a power management integrated circuit (PMIC) 1230, RF (wireless) integrated circuit (RFIC) 1225 including a wideband RF (wireless) transmitter and/or receiver (TX/RX) (e.g., including a digital baseband and an analog front end module further comprises a power amplifier on a transmit path and a low noise amplifier on a receive path), and a controller 1235. Any or all of RFIC 1225 and PMIC 1230 may also include dimensionally scaled dual-damascene interconnect structures, for example including for example including line breaks and line bridges in accordance with embodiments described herein.

Functionally, PMIC 1230 may perform battery power regulation, DC-to-DC conversion, etc., and so has an input coupled to battery 1215 and with an output providing a current supply to other functional modules. As further illustrated, in the exemplary embodiment, RFIC 1225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. Notably, each of these board-level IC modules 1225, 1230, 1235 may be integrated onto separate ICs or integrated into monolithic SoC 1250.

Figure 13:
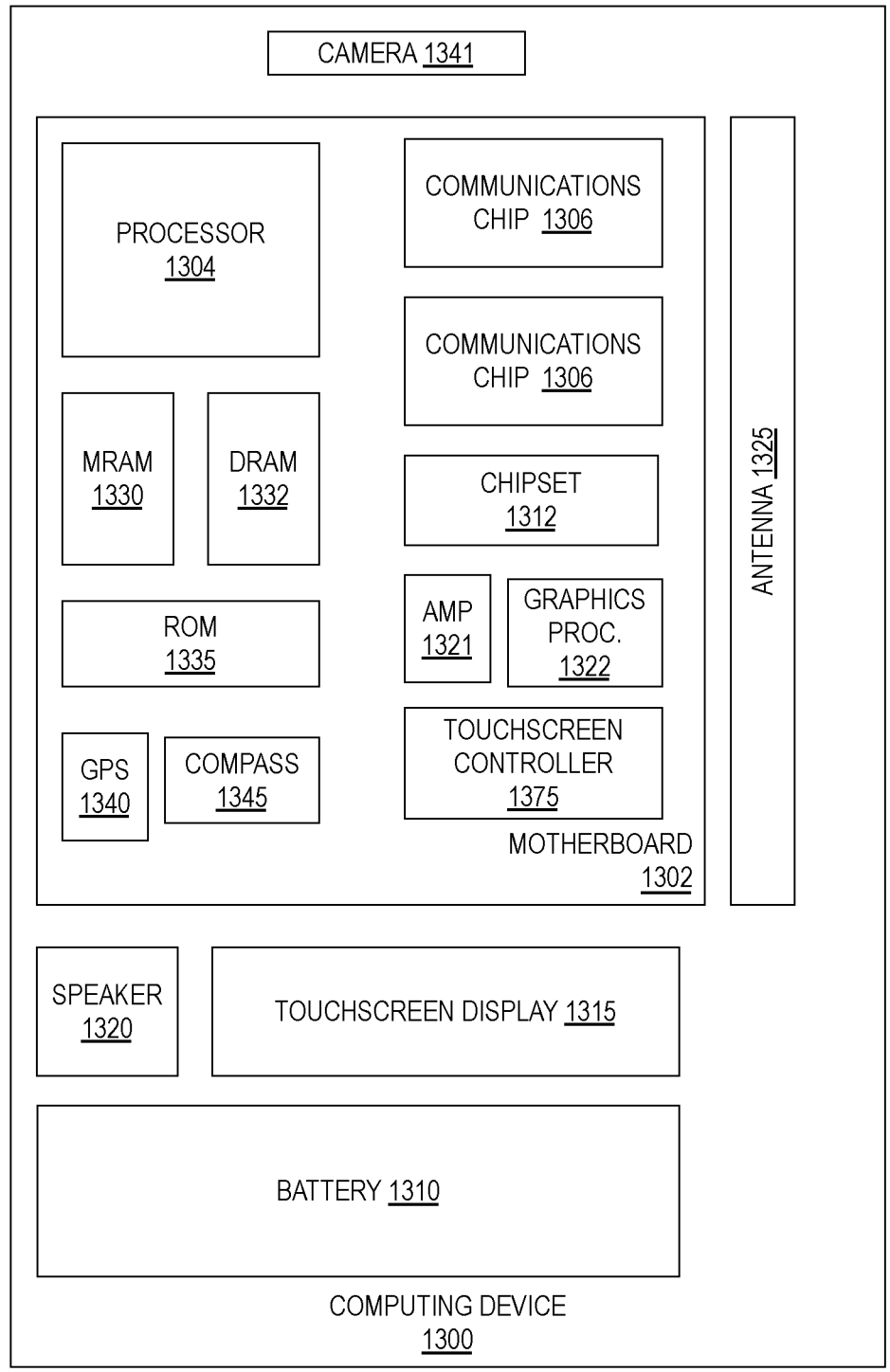
FIG. 13 is a functional block diagram of an electronic computing device, in accordance with some embodiments.

FIG. 13 is a functional block diagram of an electronic computing device 1300, in accordance with some embodiments. Computing device 1300 may be found inside platform 1205 or server machine 1206, for example. Device 1300 further includes a motherboard 1302 hosting a number of components, such as, but not limited to, a processor 1304 (e.g., an applications processor), which may further incorporate nanowire and nanoribbon transistors, for example in accordance with embodiments described herein. Processor 1304 may be physically and/or electrically coupled to motherboard 1302. In some examples, processor 1304 includes an integrated circuit die packaged within the processor 1304. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to motherboard 1302. These other components include, but are not limited to, volatile memory (e.g., MRAM 1330, DRAM 1332), non-volatile memory (e.g., ROM 1335), flash memory, a graphics processor 1322, a digital signal processor, a crypto processor, a chipset, an antenna 1325, touchscreen display 1315, touchscreen controller 1375, battery 1310, audio codec, video codec, power amplifier 1321, global positioning system (GPS) device 1340, compass 1345, accelerometer, gyroscope, audio speaker 1320, camera 1341, and mass storage device (such as hard disk drive, solid-state drive (SSD), compact disk (CD), digital versatile disk (DVD), and so forth), or the like.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In first examples, an integrated circuit (IC) structure comprises a plurality of first line segments comprising a conductive material. The first line segments have a line width separated by a space between adjacent ones of the first line segments. The IC structure comprises a plurality of plugs comprising a dielectric material. The plugs space apart ends of collinear ones of the first line segments by one or more first distances in a first lateral dimension. The IC structure comprises a plurality of second line segments comprising the conductive material. The second line segments are in a same interconnect level as the first line segments. The second line segments intersect two or more adjacent ones of the first line segments over one or more second distances in the first lateral dimension. The second line segments have end-to-end lengths in a second lateral dimension, orthogonal to the first lateral dimension. The end-to-end lengths are a first integer multiple of the line width summed with a second integer multiple of the space width. The second integer is one less than the first integer.

In second examples, for any of the first examples at least some of the second distances are greater than at least some of the first distances.

In third examples, for any of the first through second examples the first distances are at least equal to the space width.

In fourth examples, for any of first through the third examples the second distances are other than integer multiples of the first distances.

In fifth examples, for any of the first through the fourth examples ones of the plugs separate adjacent ones of the first line segments in the first lateral dimension by a third integer multiple of the space width summed with a fourth integer multiple of the line width, wherein the fourth integer is one less than the third integer.

In sixth examples, for any of the fifth examples the first integer is equal to the third integer, and the second integer is equal to the fourth integer.

In seventh examples, for any of the first through the sixth examples, the IC structure further comprises a second dielectric material between adjacent ones of the first lines, the second dielectric material having the same composition as the first dielectric material.

In eighth examples, for any of the first through the seventh examples, the space width is larger than the line width.

In ninth examples, for any of the first through the eighth examples the line width is no more than 8 nm, and the space width is at least 5 nm.

In tenth examples, for any of the first through the ninth examples every line segment of one interconnect level of an IC is either one of the first line segments or one of the second line segments.

In eleventh examples, an integrated circuit (IC) device comprises a plurality of transistors, ones of the transistors comprising one or more layers of semiconductor material. The IC device comprises a plurality of interconnect levels coupling together the transistors. One or more of the plurality of the interconnect levels further comprise a plurality of first interconnect line segments comprising a conductive material. The first line segments have a line width with a space width between adjacent ones of the first line segments. The interconnect levels further comprise a plurality of plugs comprising a dielectric material. The plugs space apart ends of collinear ones of the first line segments by one or more first distances in a first lateral dimension. The interconnect levels further comprise a plurality of second interconnect line segments comprising the conductive material. The second line segments are in a same plane as the first line segments. The second line segments intersect two or more adjacent ones of the first line segments over one or more second distances in the first lateral dimension. The second line segments have end-to-end lengths in a second lateral dimension, orthogonal to the first lateral dimension. The end-to-end lengths are a first integer multiple of the line width summed with a second integer multiple of the space width. The second integer is one less than the first integer.

In twelfth examples, for any of the eleventh examples ones of the plugs separate adjacent ones of the first line segments in the first lateral dimension by a third integer multiple of the space width summed with a fourth integer multiple of the line width, wherein the fourth integer is one less than the third integer.

In thirteenth examples, for any of the twelfth examples the first integer is at least two, and the second integer is at least one. The first integer is equal to the third integer and the second integer is equal to the fourth integer.

In fourteenth examples a computer platform comprises a data storage means to store data, and a data processing means coupled to the data storage means, wherein the data processing means includes the IC structure of any of the first through the tenth examples.

In fifteenth examples, for any of the fourteenth examples the platform comprises a battery coupled to the data processing means, and a wireless communication means coupled to the data processing means.

In sixteenth examples, a method of fabricating an integrated circuit (IC) structure comprises receiving a workpiece with a line pattern in a first mask layer, the line pattern comprising a plurality of line segments, wherein the line segments have a width, and are separated by a space width. The method comprises backfilling the first mask layer with a surrounding material, and patterning a first opening and a second opening in a second mask layer over the backfilled first mask layer. The first opening has a smaller lateral dimension than the second opening. The method comprises depositing a thin film over sidewalls of the second mask layer, the thin film reducing the lateral dimension of the second opening and completely occluding the first opening to form a plug mask. The method comprises etching the thin film to expose a top surface of the second mask layer, and removing at least one of the line segments from the first mask layer by transferring the second opening into the first mask layer. The method comprises forming a trench pattern within an underlying layer by transferring into the underlying layer a union of a remainder of the first mask layer and the plug mask. The method comprises forming interconnect lines by backfilling the underlying layer with a conductive material.

In seventeenth examples, for any of the sixteenth examples removing at least one of the line segments from the first mask layer removes only one of the line segments selectively to the surrounding material, and forming a trench pattern further comprises removing the surrounding material selectively from the line segments, the plug mask protecting a portion of the surrounding material between at least two adjacent ones of the line segments.

In eighteenth examples, for any of the sixteenth through seventeenth examples the second opening has a lateral width at least equal to the lateral width of one of the line segments summed with twice a thickness of the thin film deposited over the sidewalls of the first opening.

In nineteenth examples, for any of the eighteenth examples the first opening has a minimum lateral width no larger than twice the thickness of the thin film.

In twentieth examples, the first opening has a minimum lateral width that is larger than the space width.

In twenty-first examples, for any of the sixteenth through the twentieth examples the method further comprises non-conformally depositing a hard mask material over the spacer and removing the spacer selectively to the hard mask material prior to removing the at least one of the line segments.

In twenty-second examples, for any of the sixteenth through the twenty-first examples the interconnect lines comprise first line segments having a lateral dimension that is approximately equal to the width and second line segments intersecting two or more adjacent ones of the first line segments, and wherein the second line segments have a lateral dimension that is at least twice the width summed with the space.

In twenty-third examples, for any of the sixteen through the twenty-second examples etching the thin film to expose the top surface of the second mask layer further comprises an isotropic etch of the thin film.

In twenty-fourth examples, for any of the sixteenth through the twenty-third examples etching the thin film to expose the top surface of the second mask layer further comprises an anisotropic etch of the thin film, the anisotropic etch leaving sidewall spacers along a sidewall of the second opening.

In twenty-fifth examples, for any of the twenty-fourth examples the method further comprises removing the sidewall spacers before removing at least one of the line segments from the first mask layer.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
four or more first line segments comprising conductive material, wherein the first line segments have a same line width and adjacent ones of the first line segments are separated by a same space width;
a plurality of plugs comprising a dielectric material, wherein the plugs space apart ends of collinear ones of the first line segments by one or more first distances in a first lateral dimension; and
a plurality of second line segments comprising conductive material, wherein:
the second line segments are in a same interconnect level as the first line segments;
each of the second line segments intersect two different adjacent ones of the first line segments over one or more second distances in the first lateral dimension; and
each of the second line segments have equal end-to-end lengths in a second lateral dimension, orthogonal to the first lateral dimension, wherein the end-to-end lengths are equal to a first integer multiple of the line width summed with a second integer multiple of the space width, and wherein the second integer is one less than the first integer.

2. The IC structure of claim 1, wherein at least some of the second distances are greater than at least some of the first distances.

3. The IC structure of claim 2, wherein the first distances are at least equal to the space width.

4. The IC structure of claim 1, wherein the second distances are other than integer multiples of the first distances.

5. The IC structure of claim 1, wherein:
ones of the plugs separate adjacent ones of the first line segments in the first lateral dimension by a third integer multiple of the space width summed with a fourth integer multiple of the line width, wherein the fourth integer is one less than the third integer.

6. The IC structure of claim 5, wherein the first integer is equal to the third integer, and the second integer is equal to the fourth integer.

7. The IC structure of claim 1, further comprising a second dielectric material between adjacent ones of the first lines, the second dielectric material having the same composition as the first dielectric material.

8. The IC structure of claim 1, wherein the space width is larger than the line width.

9. The IC structure of claim 8, wherein:
the line width is no more than 8 nm; and
the space width is at least 5 nm.

10. The IC structure of claim 1, wherein every line segment of one interconnect level of an IC is either one of the first line segments or one of the second line segments.

11. An integrated circuit (IC) device, comprising:
a plurality of transistors, ones of the transistors comprising one or more layers of semiconductor material; and
a plurality of interconnect levels coupling together the transistors, wherein one or more of the plurality of the interconnect levels further comprise:
four or more first interconnect line segments comprising conductive material, wherein the first line segments have a same line width with a same space width between adjacent ones of the first line segments;
a plurality of plugs comprising a dielectric material, wherein the plugs space apart ends of collinear ones of the first line segments by one or more first distances in a first lateral dimension; and
a plurality of second interconnect line segments comprising conductive material, wherein:
the second line segments are in a same interconnect level as the first line segments;
each of the second line segments intersect two different adjacent ones of the first line segments over one or more second distances in a first lateral dimension; and
the second line segments have equal end-to-end lengths in a second lateral dimension, orthogonal to the first lateral dimension, wherein the end-to-end lengths are a first integer multiple of the line width summed with a second integer multiple of the space width, and wherein the second integer is one less than the first integer.

12. The IC device of claim 11, wherein ones of the plugs separate adjacent ones of the first line segments in the first lateral dimension by a third integer multiple of the space width summed with a fourth integer multiple of the line width, wherein the fourth integer is one less than the third integer.

13. The IC device of claim 12, wherein:
the first integer is at least two, and the second integer is at least one; and
the first integer is equal to the third integer and the second integer is equal to the fourth integer.

14. A method of fabricating an integrated circuit (IC) structure, comprising:
receiving a workpiece with a line pattern in a first mask layer, the line pattern comprising a plurality of line segments, wherein the line segments have a width, and are separated by a space width;
backfilling the first mask layer with a surrounding material;
patterning a first opening and a second opening in a second mask layer over the backfilled first mask layer, wherein the first opening has a smaller lateral dimension than the second opening;
depositing a thin film material over sidewalls of the second mask layer, the thin film material reducing the lateral dimension of the second opening and completely occluding the first opening to form a plug mask;
etching the thin film material to expose a top surface of the second mask layer;
removing at least one of the line segments from the first mask layer by transferring the second opening into the first mask layer;
forming a trench pattern within an underlying layer by transferring into the underlying layer a union of a remainder of the first mask layer and the plug mask; and
forming interconnect lines by at least partially backfilling the underlying layer with conductive material.

15. The method of claim 14, wherein:
removing at least one of the line segments from the first mask layer removes only one of the line segments selectively to the surrounding material; and
forming a trench pattern further comprises removing the surrounding material selectively from the line segments, the plug mask protecting a portion of the surrounding material between at least two adjacent ones of the line segments.

16. The method of claim 15, wherein the second opening has a lateral width at least equal to the lateral width of one of the line segments summed with twice a thickness of the thin film deposited over the sidewalls of the first opening.

17. The method of claim 15, wherein the first opening has a minimum lateral width no larger than twice the thickness of the thin film.

18. The method of claim 17, wherein the first opening has a minimum lateral width that is larger than the space.

19. The method of claim 15, further comprising non-conformally depositing a hard mask material over the spacer and removing the spacer selectively to the hard mask material prior to removing the at least one of the line segments.

20. The method of claim 15, wherein the interconnect lines comprise:
- first line segments having a lateral dimension that is approximately equal to the width; and
- second line segments intersecting two or more adjacent ones of the first line segments, and wherein the second line segments have a lateral dimension that is at least twice the width summed with the space.

\* \* \* \* \*